United States Patent
Karaca et al.

(10) Patent No.: US 12,322,665 B2
(45) Date of Patent: Jun. 3, 2025

(54) INTEGRATED CIRCUIT

(71) Applicant: NXP B.V., Eindhoven (NL)

(72) Inventors: Denizhan Karaca, Nijmegen (NL); Gijs Jan de Raad, Bemmel (NL); Marcus van der Vossen, Enschede (NL); Eric Thomas, Troarn (FR)

(73) Assignee: NXP B.V., Eindhoven (NL)

(*) Notice: Subject to any disclaimer, the term of this patent is extended or adjusted under 35 U.S.C. 154(b) by 490 days.

(21) Appl. No.: 17/661,729

(22) Filed: May 2, 2022

(65) Prior Publication Data
US 2022/0359318 A1    Nov. 10, 2022

(30) Foreign Application Priority Data

May 7, 2021    (EP) .................................... 21305592

(51) Int. Cl.
*H01L 23/00* (2006.01)
*H01L 21/66* (2006.01)
*H01L 23/60* (2006.01)
*H01L 23/66* (2006.01)
*H03K 17/0812* (2006.01)

(52) U.S. Cl.
CPC ............. *H01L 22/34* (2013.01); *H01L 22/32* (2013.01); *H01L 23/60* (2013.01); *H01L 23/66* (2013.01); *H03K 17/08122* (2013.01); *H01L 2223/6672* (2013.01); *H01L 2223/6677* (2013.01)

(58) Field of Classification Search
CPC ......... H01L 22/34; H01L 22/32; H01L 23/60; H01L 23/66; H03K 17/08122
See application file for complete search history.

(56) References Cited

U.S. PATENT DOCUMENTS

| 4,653,084 A * | 3/1987 | Ahuja ................... H04M 3/301 |
| | | 379/27.06 |
| 7,649,722 B2 * | 1/2010 | Thijs ....................... H03F 3/605 |
| | | 361/93.5 |
| 8,000,068 B2 * | 8/2011 | Brown, Jr. ........ H03K 17/08104 |
| | | 361/118 |

(Continued)

OTHER PUBLICATIONS

Chen, Yuh-Yue et al; "ESD Considerations for SOI Switch Design"; IEEE Int'l SOI Conference; 2 pages (2011).

(Continued)

*Primary Examiner* — Mounir S Amer
*Assistant Examiner* — Alexander Belousov (57) ABSTRACT

An integrated circuit, IC, comprising one or more DC blocking modules connected to a respective input/output, IO, pin of the IC, each DC blocking module comprising: a capacitor having a first terminal connected to the respective IO pin and a second terminal connected to a node of the circuitry of the IC; and an electrostatic discharge, ESD, protection circuit connected in parallel to the capacitor, the ESD protection circuit comprising: a conduction path connected between the first terminal of the capacitor and the second terminal of the capacitor; and a control terminal configured to receive a control signal to switch the ESD protection circuit between: an operational mode in which the conduction path is in a non-conducting state and provides ESD protection to the capacitor; and a test mode in which the conduction path is in a conducting state and short circuits the capacitor.

14 Claims, 5 Drawing Sheets

(56) References Cited

U.S. PATENT DOCUMENTS

| | | | | |
|---|---|---|---|---|
| 8,773,038 | B2* | 7/2014 | Logiudice | H05B 47/24 |
| | | | | 315/307 |
| 8,982,520 | B2* | 3/2015 | Predtetchenski ... | G06F 13/4072 |
| | | | | 361/91.5 |
| 9,064,704 | B2 | 6/2015 | Takatani et al. | |
| 9,408,266 | B2* | 8/2016 | Logiudice | H05B 45/48 |
| 9,685,949 | B2* | 6/2017 | Yamamoto | H03F 3/245 |
| 9,907,151 | B2* | 2/2018 | Ichikawa | H05B 47/25 |
| 10,354,994 | B2* | 7/2019 | Robbins | H10D 89/911 |
| 10,420,196 | B2* | 9/2019 | Ichikawa | H05B 45/39 |
| 12,021,076 | B2* | 6/2024 | de Raad | H03K 17/08104 |
| 2007/0058308 | A1* | 3/2007 | Thijs | H03F 3/195 |
| | | | | 361/56 |
| 2010/0073837 | A1* | 3/2010 | Predtetchenski ... | G06F 13/4072 |
| | | | | 361/91.1 |
| 2010/0103571 | A1* | 4/2010 | Brown, Jr. | H10D 89/60 |
| | | | | 361/56 |
| 2011/0176245 | A1 | 7/2011 | Worley et al. | |
| 2013/0049599 | A1* | 2/2013 | Logiudice | H05B 45/48 |
| | | | | 315/122 |
| 2014/0292201 | A1* | 10/2014 | Logiudice | H05B 45/48 |
| | | | | 315/122 |
| 2016/0081171 | A1* | 3/2016 | Ichikawa | H05B 47/25 |
| | | | | 315/77 |
| 2017/0310103 | A1 | 10/2017 | Gao et al. | |
| 2018/0160515 | A1* | 6/2018 | Ichikawa | H05B 47/25 |
| 2022/0359318 | A1* | 11/2022 | Karaca | H01L 23/60 |
| 2023/0115302 | A1* | 4/2023 | de Raad | H03K 17/102 |
| | | | | 257/355 |

OTHER PUBLICATIONS

Hill, Cameron et al; "RF Watt-Level Low-Insertion-Loss High Bandwidth SOI CMOS Switches"; IEEE Trans. On Microwave Theory and Techniques vol. 66, No. 12; 13 pages (Dec. 2018).

Hyvonen, S. et al; "Comprehensive ESD Protection for RF Inputs"; Microelectronics Reliability: An Internat; Journal and World Abstracting Services, Elsevier Science LTD, GB; vol. 45, No. 2; 10 pages (Feb. 1, 2005).

Vinson, James E. et al; "ESD Design and Analysis Handbook"; Springer Science & Business Media—pp. 128-129; 207 pages (Dec. 6, 2012).

Joseph, Alvin et al; "Power Handling Capability of an SOI RF Switch"; IEEE Radio Frequency Integrated Circuits Symposium (RFIC); 4 pages (2013).

\* cited by examiner

INTEGRATED CIRCUIT

CROSS-REFERENCE TO RELATED APPLICATIONS

This application claims the priority under 35 U.S.C. § 119 of European patent application no. 21305592.4, filed May 7, 2021 the contents of which are incorporated by reference herein.

Field

The present disclosure relates to an integrated circuit and in particular to DC testing of an integrated circuit.

Background

US 2010/103571 A1 describes ESD protection for field effect transistors of analog input circuits.

Summary

According to a first aspect of the present disclosure there is provided an integrated circuit, IC, comprising one or more DC blocking modules connected to a respective input/output, IO, pin of the IC, each DC blocking module comprising:

a capacitor having a first terminal connected to the respective IO pin and a second terminal connected to a node of the circuitry of the IC; and an electrostatic discharge, ESD, protection circuit connected in parallel to the capacitor, the ESD protection circuit comprising:

- a conduction path connected between the first terminal of the capacitor and the second terminal of the capacitor; and
- a control terminal configured to receive a control signal to switch the ESD protection circuit between:

an operational mode in which the conduction path is in a non-conducting state and provides ESD protection to the capacitor; and a test mode in which the conduction path is in a conducting state and short circuits the capacitor.

The dual mode ESD protection circuit advantageously provides ESD protection for the capacitor in the operational mode, while enabling DC test measurements in the test mode.

In one or more embodiments the ESD protection circuit of each DC blocking module may comprise a transistor. A conduction channel of the transistor may form the conduction path of the ESD protection circuit. A control terminal of the transistor may form the control terminal of the ESD protection circuit. The transistor may be a field effect transistor.

In one or more embodiments the ESD protection circuit of one or more DC blocking modules may comprise a plurality of transistors. Conduction channels of the transistors may be connected in series to form the conduction path of the ESD protection circuit. Control terminals of the transistors may be connected together to form the control terminal of the ESD protection circuit. The plurality of transistors may comprise a plurality of field effect transistors.

In one or more embodiments the control terminal of the ESD protection circuit of each DC blocking module may be configured to receive the control signal to switch the ESD protection circuit from the operational mode to the test mode.

In one or more embodiments the ESD protection circuit of each DC blocking module may be configured to operate in the operational mode in the absence of a control signal.

In one or more embodiments the IC may be a radio frequency IC, RFIC.

In one or more embodiments the IC may further comprise a control circuit. The control circuit may be configured to provide the control signal to the control terminal of the ESD protection circuit of each DC blocking module.

In one or more embodiments the control circuit may comprise one or more test pads. The one or more test pads may be accessible to an automated test machine prior to packaging of the IC.

In one or more embodiments the control circuit may be configured to provide the control signal to the control terminal of the ESD protection circuit of one or more DC blocking modules in response to receiving a test enable signal at one or more test pads.

According to a second aspect of the present disclosure, there is provided a IC package comprising:

the IC; and a package housing the IC, wherein the package prevents access to the one or more test pads.

According to a third aspect of the present disclosure, there is provided a switch circuit for a radio frequency front end, RFFE, module, comprising any of the ICs disclosed herein or any of the IC packages disclosed herein, wherein the IC is an RFIC.

According to a fourth aspect of the present disclosure there is provided a RFFE module comprising any of the ICs disclosed herein, any of the IC packages disclosed herein or any of the switch modules disclosed herein, wherein the IC is an RFIC.

According to a fifth aspect of the present disclosure, there is provided a method of processing a semiconductor wafer comprising a plurality of any of the ICs disclosed herein, the method comprising:

for one or more DC blocking modules of each IC:

- providing a control signal to the control terminal of the ESD protection circuit of the DC blocking module to operate the ESD protection circuit in the test mode;
- performing a DC test on a signal path between the respective IO pin and a further terminal of the circuitry of the IC; and
- removing the control signal from the control terminal of the ESD protection circuit of the DC blocking module to operate the ESD protection circuit in an operational mode.

In one or more embodiments, the method further comprises:

identifying compliant ICs of the plurality of ICs that pass a test requirement of the DC test for the one or more DC blocking modules of the IC;

dicing the semiconductor wafer into individual ICs; and packaging each compliant IC.

In one or more embodiments, the steps of providing the control signal to the control terminal and performing the DC test are performed in response to applying a test enable signal to a test pad of the IC using an automated test machine. Packaging each compliant IC may comprise making the test pad inaccessible.

While the disclosure is amenable to various modifications and alternative forms, specifics thereof have been shown by way of example in the drawings and will be described in detail. It should be understood, however, that other embodiments, beyond the particular embodiments described, are possible as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

A complete understanding of the subject matter may be derived by referring to the detailed description and claims when considered in conjunction with the following figures, wherein like reference numbers refer to similar elements throughout the figures.

DETAILED DESCRIPTION

Many integrated circuits (ICs) have a series connected capacitor in one or more of their input/output paths. The provision of this DC blocking capacitor is usually to satisfy a system requirement that the die will connect to other circuitry operating at a different DC voltage and/or connect to an antenna which is exposed and should not carry a DC voltage other than the ground potential.

Two particular issues can arise from having series connected capacitors at the input or outputs of an IC. Firstly, the capacitors are susceptible to electrostatic discharge (ESD). Most capacitors are (quite) weak under ESD and may be irreversibly damaged. Secondly, the provision of the capacitors at input/output (IO) pins (or IO pads) may prevent DC testing at those IO pins of the IC.

As described herein, an IO pin or pad may refer to a node in the IC that can be coupled to an external circuit or device. For example, the IO pin/pad may be a wire-bonding pad or a terminal connected to the wire-bonding pad. An IO pad may be a physical connection point (for example, a metal plate at the top metal layer) which can connect the IC to an external circuit or a device (a leadframe, a package, a PCB etc.), for example via a bondwire, a copper pillar, a conductive bump or other suitable connecting means. An IO pin may refer to a node of an IC which can be connected to an external circuit or device. In some examples, an IO pin or pad may receive a RF signal from the IC and pass it to another device. In other examples, the IO pin or pad may receive a RF signal from an external source and provide it to the IC. For example, in a near-field communication IC, an IO pad of an IC may receive an RF signal from an external source and provide the RF signal to a voltage supply of the IC for powering the IC.

In industrial wafer testing, there can be thousands of ICs on a single wafer. Each IC can require testing to determine whether it meets a performance specification. Following testing the wafer may be diced into individual ICs. ICs that pass the test process may proceed to packaging; ICs that fail may be discarded.

DC tests can be performed in a short timescale. As a result, an automated test machine can scan a probe across the wafer measuring all IC dies and marking those that work or not. DC testing provides a simple and efficient test procedure.

Radio frequency ICs (RFICs) (or high frequency circuits more generally) may also require high frequency testing to determine RF performance parameters. RF testing has several disadvantages compared to DC testing. RF testing is more complex, expensive, time consuming and error prone. Furthermore, the RF measurement on a bare wafer may be a poor indicator of the final performance parameter for the packaged end product.

Some RF test parameters can be accurately determined or correlated to DC test parameters (as discussed below in relation to FIG. 3). Therefore, where possible, it is preferable to perform a DC test to measure a circuit parameter rather than a high frequency test. As a result, the number of required high frequency tests should be minimized. However, the provision of the blocking capacitor at an IO pin can prevent the use of the simpler DC tests.

Figure 1A:
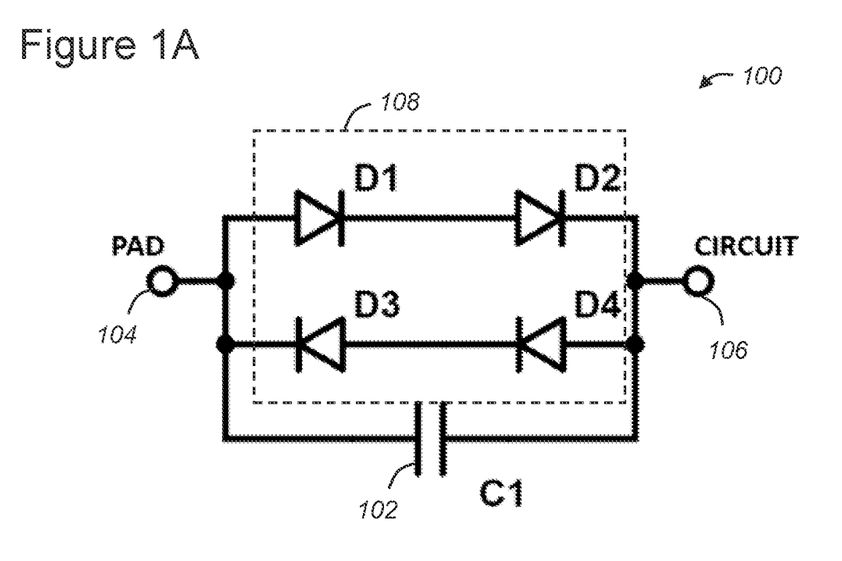
FIG. 1A shows an example ESD protection scheme for a series connected capacitor at an IO pin of an IC.
Figure 1B:
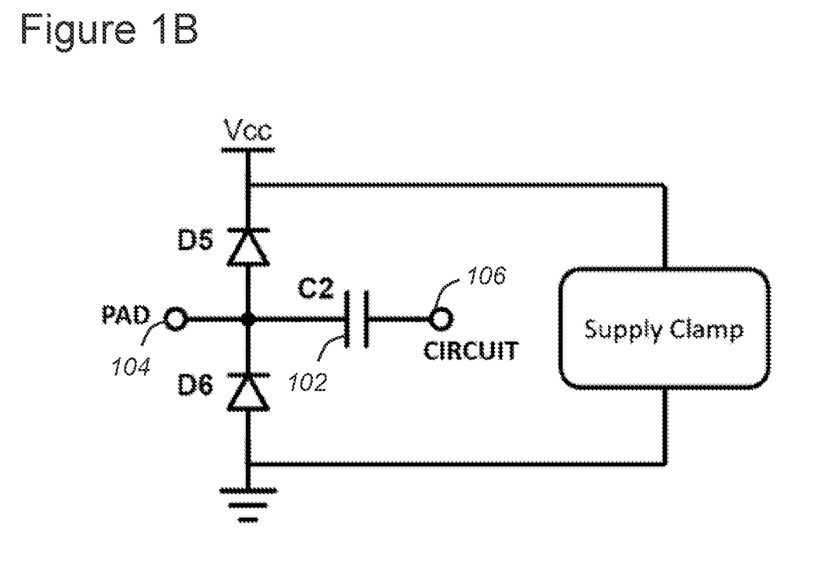
FIG. 1B shows another example ESD protection scheme for a series connected capacitor at an IO pin of an IC.

The first issue identified above, the ESD susceptibility of the capacitors, may be overcome in a number of ways. FIGS. 1A and 1B illustrate two different approaches to overcoming ESD susceptibility in series connected capacitors at IO pins of an IC.

In FIG. 1A, an IC 100 includes a DC blocking capacitor 102 connected in series between an IO pin (PAD) 104 and a node of the remaining circuitry (CIRCUIT) 106 of the IC 100. An ESD protection device 108 is connected in parallel to the capacitor 102 to provide a required level of ESD robustness to the IC 100. In this example, the ESD protection device 108 comprises antiparallel diodes (D1, D2, D3, D4) which will protect the DC blocking capacitor 102 during an ESD event. Depending on the blocked DC level, a higher number of diodes may be required which results in a higher silicon area and additional parasitic capacitance to the substrate. In other examples, the ESD protection device 108 may comprise clamp devices other than diodes, such as field-effect-transistor (FET) pairs or FET-diode pairs.

FIG. 1B illustrates a rail-based protection circuit which can be useful in low power applications. Similar to FIG. 1A, an IC 100 includes a DC blocking capacitor 102 connected in series between an IO pin (PAD) 104 and the remaining circuitry (CIRCUIT) 106 of the IC 100. Diodes (D5, D6) connect a node between the IO pin 104 and the capacitor 102 to high and low voltage rails which are coupled with a supply clamp. However, the rail-based protection circuit is not suitable for applications where high voltage swings are required at the IO pin 104 because the diodes will turn on.

Both ESD protection examples illustrated in FIGS. 1A and 1B fail to address the second issue identified above, namely the inability to perform DC circuit testing at IO pins having a blocking capacitor. DC testing remains partially or fully blocked by the DC-blocking capacitor 102. In the example of FIG. 1A, DC testing may be possible in some cases by taking into account a voltage drop of the diodes. However, RFIC circuit testing typically involves measuring a small resistance and the error introduced by the voltage drop of the diodes would render the measurement of such a resistance inaccurate. In the example of FIG. 1B, the DC blocking capacitor 102, by definition, prevents current passing between the IO pin 104 and the remaining circuitry. As a result, DC testing of the IC 100 is simply not possible.

Figure 2:
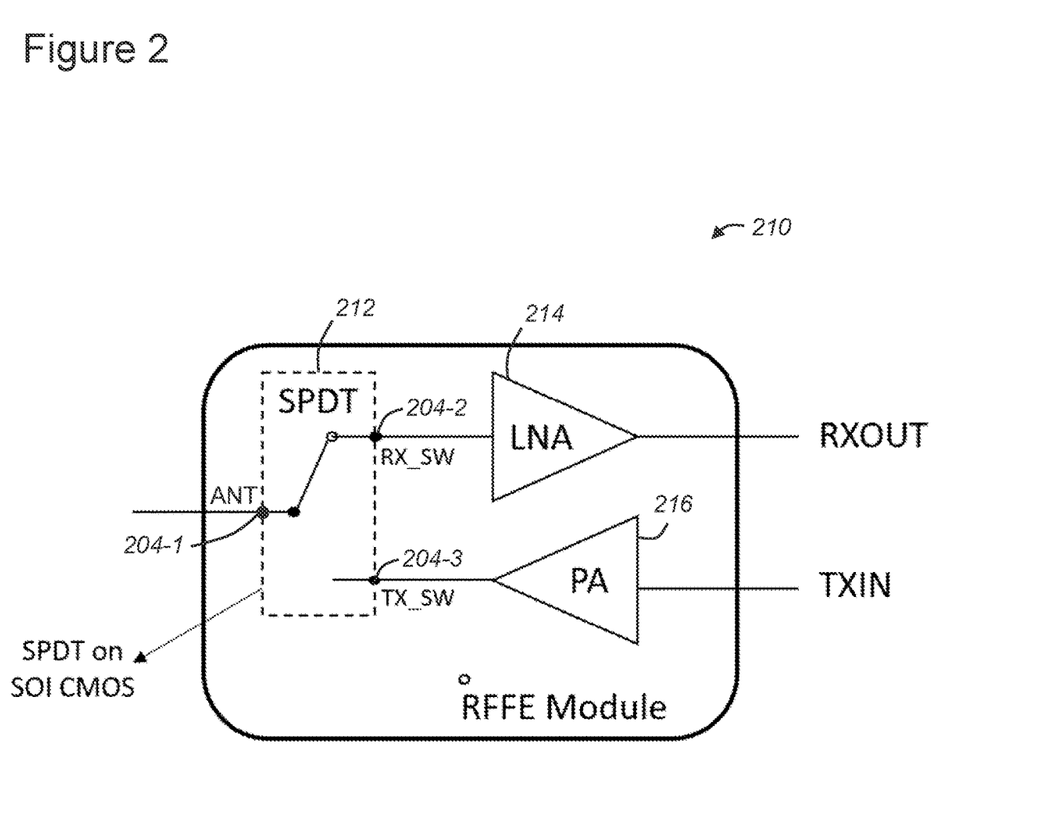
FIG. 2 shows a RFFE module.

FIG. 2 illustrates a block diagram of an RF front-end (RFFE) module 210 for base stations. The RFFE module 210 comprises multiple sub-modules that may each be formed on different dies and connected to each other in the RFFE package 210. The sub-modules can operate at different DC voltages and therefore a DC blocking capacitor may be required on one or more of the sub-modules. The sub-modules of an RFEE module 210 are examples of RFICs that require wafer testing.

In this example, the sub-modules comprise a single pole double throw (SPDT) switch module 212, a low noise amplifier (LNA) 214 and a power amplifier (PA) 216. The PA 216 may receive transmission signals, TXIN, from a main circuit (not shown), for transmission via an antenna (not shown). The PA 216 can amplify the transmission signals, TXIN, and provide amplified transmission signals to a transmission terminal, TX_SW, 204-3 of the SPDT switch module 212. The transmission terminal 204-3 is an example of an IO pin of the SPDT switch module 212. The SPDT switch module 212 can operate in a first mode to couple the amplified transmission signals to an antenna terminal, ANT, 204-1 coupled to the antenna. The antenna terminal, 204-1 is an example of an IO pin of the SPDT switch module 212.

The SPDT switch module 212 can operate in a second mode to couple received signals received at the antenna terminal 204-1 to a receiver terminal, RX_SW, 204-2. The receiver terminal 204-2 is an example of an IO pin of the SPDT switch module 212. The LNA 214 can amplify the received signals and pass amplified received signals, RXOUT, to the main circuit.

Complementary metal-oxide-semiconductor (CMOS) silicon on insulator (SOI) technology may often be used for implementing the SPDT switch module 212 because of high voltage swings required at the antenna terminal 204-1 the transmission terminal 204-3 and the receiver terminal, RX_SW 204-2.

Figure 3:
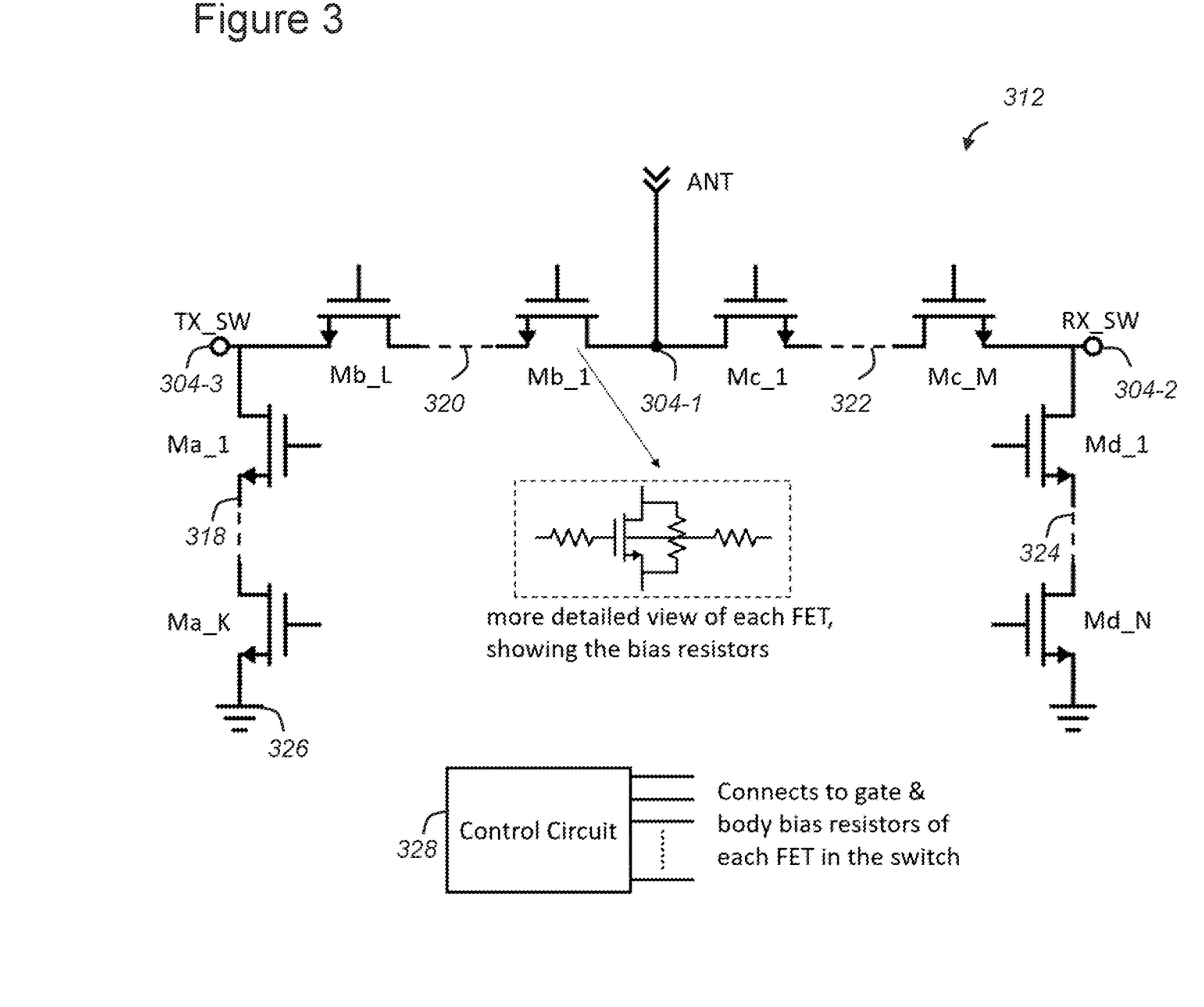
FIG. 3 shows a SPDT switch module.

FIG. 3 illustrates a schematic of an example series shunt SPDT switch circuit 312 built from MOSFETS. CMOS SOI technology can enable a large number of MOSFETs to be stacked depending on the power handling requirements of the module 312. The switch circuit 312 comprises four branches of stacked MOSFETS: (i) a first shunt branch 318 of stacked FETs (Ma_1 . . . Ma_K) is connected between the transmission terminal 304-3 and a reference terminal 326; (ii) a first series branch 320 of stacked FETs (Mb_1 . . . Mb_L) is connected between the transmission terminal 304-3 and the antenna terminal 304-1; (iii) a second series branch 322 of stacked FETs (Mc_1 . . . Ma_M) is connected between the antenna terminal 304-1 and the receiver terminal 304-2; and (iv) a second shunt branch 324 of stacked FETs (Md_1 . . . Ma_N) is connected between the receiver terminal 304-2 and the reference terminal 326.

In this example, each of the stacked FETs may comprise a biasing arrangement such as that illustrated in the Figure inset. The biasing arrangement may include a first biasing resistor coupling a drain terminal of the FET to a source terminal of the FET. The first biasing resistor may provide a resistance of a few kohms between the drain and the source terminals. A gate biasing resistor may be connected to a gate terminal of the FET for biasing received control signals. A body biasing resistor may be coupled to a body terminal of the FET to provide a body bias to the FET.

In this example, the switch circuit 312 also comprises a control circuit 328. The control circuit 328 is coupled to the gate biasing resistor of each FET and provides corresponding control signals. The control circuit 328 is also coupled to the body biasing resistor of each FET to control the overall bias of each FET.

Two important performance test parameters of the switch circuit 312 are its insertion loss and port isolation. There is a strong correlation between the ON resistance of a series branch 320, 322 and the insertion loss of the corresponding signal path. Similarly, the isolation between two terminals or IO pins 304-1, 304-2, 304-3 is a strong function of the ON resistance of the corresponding shunt branch 318, 324. Therefore, a test pass/fail criteria can be defined based on the DC ON resistances, Rds_on, of the series/shunt branches 318, 320, 322, 324 rather than actually measuring an insertion loss and isolation between the respective IO pins 304-1, 304-2, 304-3 which can require costly, time-consuming high-frequency measurements. The Rds_on measurements can be conducted by activating one of the four series/shunt branches 318, 320, 322, 324 and injecting a small DC current to the relevant terminal and measuring the voltage drop over the branch under test.

As shown, the switch module 312 of FIG. 3 is compatible with Rds_on measurements with DC testing and is self-protecting from ESD provided that the FETs are large enough to pass the required ESD current levels. However, all RF IO pins 304-1, 304-2, 304-3 of this circuit are DC coupled, which poses a problem when the switch die is to be connected to the other dies on the RFFE module.

As explained above, for RFFE modules such as the one shown in FIG. 2, the sub-modules connected to the switch module (the LNA and the PA) are typically implemented on different dies, possibly using different technologies. This allows cost reduction and performance improvement. As a result, a DC blocking capacitor is placed between the switch module 312 and each of the LNA and PA to allow for different DC operating points of each separate die. For example, the output of the switch module may be at 0V and the input of the LNA may be at 0.8 V. The DC blocking capacitor can be implemented on either the LNA/PA die or on the switch module die 312. Implementing the DC blocking capacitor on the switch module 312 can be advantageous because:

1. If the LNA (or PA) die is using a bulk silicon technology such as Qubic4, a high performance BiCMOS technology suitable for RF circuits, the parasitic capacitance of a large AC-coupling capacitor to the substrate will have more noise contribution than that of a capacitor in SOI technology.

2. Introducing a series capacitor on the LNA die will require an ESD protection scheme as illustrated in FIG. 1A or 1B, or a shunt coil at the input pin, all of which have a higher noise contribution than their counterparts in the SOI technology. This is because the substrate parasitic capacitances of diodes and inductors are substantially lower in SOI.

Due to abovementioned noise contributions, the noise figure (NF) of the RX chain can deteriorate by 0.1-0.2 dB if the DC blocking capacitor is placed on the LNA die instead of the switch module die (likewise, the linearity of a PA would degrade by a similar amount), the exact amount depending on the technologies used. Therefore, it is advantageous to implement the DC blocking capacitor on the switch module 312.

However, if a DC blocking capacitor is placed in series at either the receiver terminal 304-2 or the transmission terminal 304-3 of the switch circuit 312, it will no longer be possible to measure Rds_on for the corresponding branch 318, 320, 322, 324 using a DC test set-up. In addition, the IO pins 304-2, 304-3 will no longer be ESD compatible.

ESD compatibility could be implemented by connecting an ESD protection device such as the anti-parallel diodes of FIG. 1A. However, with such an arrangement, the DC ON resistance, Rds_on, measurement will not be possible because Rds_on of each branch of the RF switch module 312 is relatively low, typically in the range of 0.1 to 10 ohms. Therefore, injection of a small test current (<10 mA) will result in a voltage drop across the branch of only a few millivolts. If a diode voltage drop of ~0.7V is included in the Rds_on measurement, the accuracy of the measurement will reduce drastically, particularly in view of the process and temperature dependency of the diode voltage drop. Furthermore, in most circuits, a stack of diodes is needed to block the DC current in normal circuit operation and the resulting inaccuracy is even higher (N×0.7V, where N is the number of stacked diodes).

Figure 4:
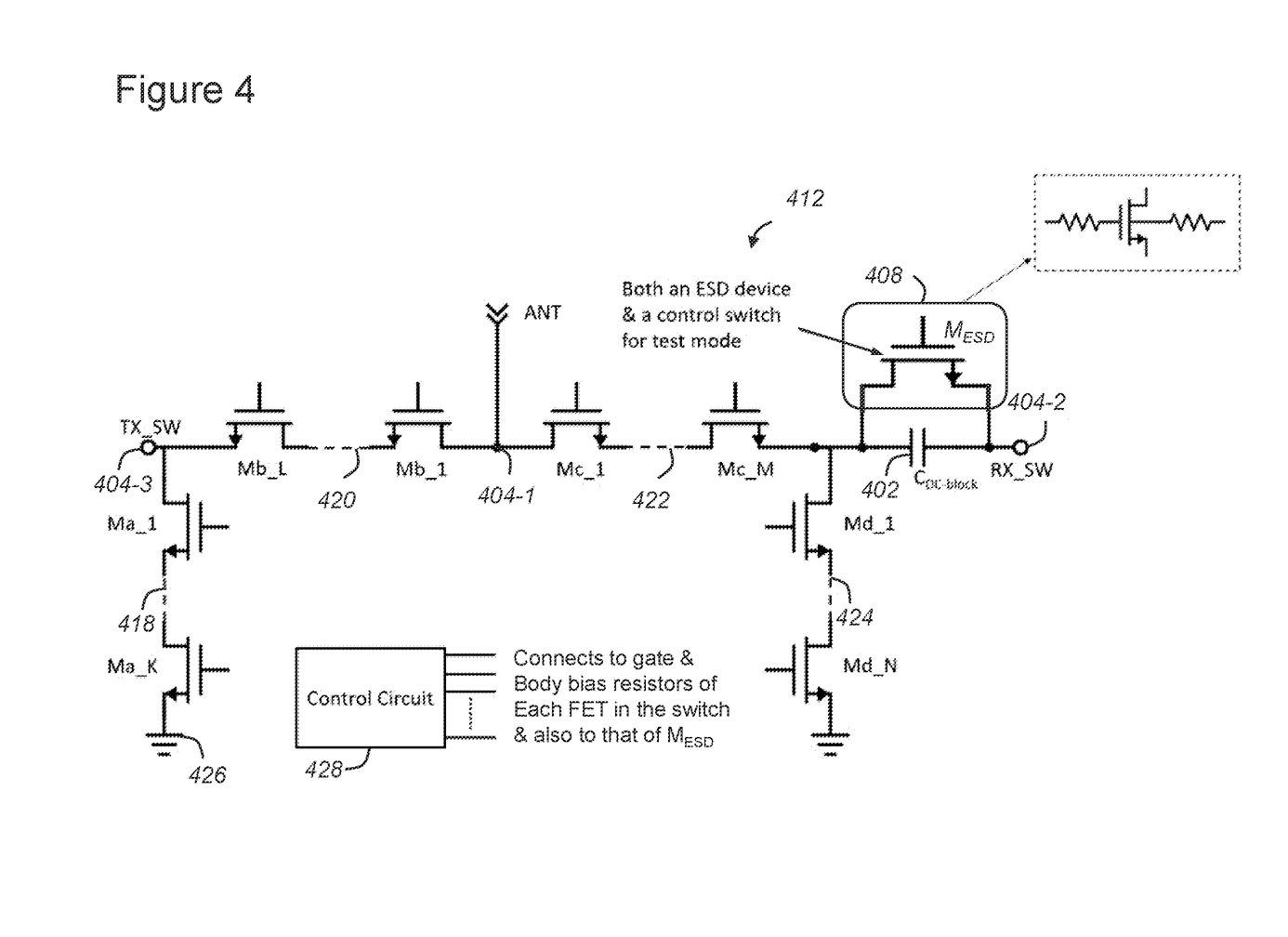
FIG. 4 shows an RFIC according to an embodiment of the present disclosure.

FIG. 4 illustrates an example RFIC 412 according to an embodiment of the present disclosure. In this example, the RFIC 412 is a SPDT switch module 412 similar to that of FIG. 3. Features of FIG. 4 that are also present in FIG. 3 have been given corresponding reference numbers in the 400 series and will not necessarily be described again here.

The RFIC 412 comprises a (DC blocking) capacitor, CDC-block, 402 having a first terminal connected to an IO pin (receiver terminal) 404-2 and a second terminal connected to a node of the remaining circuitry of the RFIC 412. The RFIC also comprises an ESD protection circuit 408 connected in parallel to the capacitor 402. In this example, the ESD protection circuit 408 comprises a MOSFET, MESD. The capacitor 402 and the ESD protection circuit 408 together form a DC blocking module of the RFIC. The ESD protection circuit 408 comprises a conduction path connected between the first terminal of the capacitor 402 and the second terminal of the capacitor 402. In this example, the conduction channel of the FET, MESD, that is the channel between a drain and a source of the FET, forms the conduction path of the ESD protection device 408. The ESD protection circuit 408 also comprises a control terminal configured to receive a control signal. In this example, the gate terminal of the FET forms the control terminal of the ESD protection circuit. The control terminal may receive the control signal and in response switch the ESD protection circuit 408 between: (i) an operational mode in which the conduction path of the ESD protection circuit 408 is in a non-conducting state and provides ESD protection to the capacitor 402; and (ii) a test mode in which the conduction path of the ESD protection circuit 408 is in a conducting state and provides a DC path that short-circuits the capacitor 402.

The ESD protection circuit 408 of the DC blocking module of the RFIC 412 is advantageously controllable and can be put into a test mode to enable DC testing of the RFIC with the associated manufacturing advantages described above. Following fabrication of the RFIC, the ESD protection circuit 408 of the DC blocking module can reside in an operational mode providing ESD protection functionality. As defined herein, the test/operational modes of the ESD protection circuit may be referred to as the test/operational modes of the corresponding DC blocking module.

The dual mode ESD protection circuit or FET 408 provides ESD protection for the capacitor 402 in the operational mode, while enabling DC test measurements, such as Rds_on measurements, in the test mode. The operational mode may be considered as an OFF mode during which there is no impact on circuit operation and the FET 408 provides ESD protection functionality for the series capacitor 402 at the IO pin 404-2. The test mode may be considered as an ON mode during which the FET 408 shorts the DC blocking capacitor 402 and provides a DC path for DC testing.

During the operational mode, the FET 408 functions like a capacitor in parallel with the DC blocking capacitor 402. The DC blocking capacitor 402 may have a sufficiently high capacitance such that there will be a negligible voltage swing across the capacitor 402 due to the presence of an RF signal. As a result, the FET 408 will remain OFF (non-conducting) during normal operation. Therefore, the FET 408 will have negligible impact on the RF performance of the switch module 412. The FET 408 may introduce a parasitic capacitance to the substrate, however this is negligible in a SOI platform. In some examples, the FET 408 may be sized to pass a specified or rated ESD current.

During the test mode, the FET 408 is switched ON and functions like a low-ohmic resistor. The FET 408 may be arranged to remain in a linear region of operation. For the switch module 412 of FIG. 4, DC testing can be performed to measure Rds_on for all branches connected to the receiver IO pin 404-2. In this way, a DC test process, such as the one described below with reference to FIG. 5, can conclude whether the RFIC 412 is a pass or a fail. Advantageously, a RF high-frequency test process is not required to measure insertion loss and isolation at radio frequencies. The FET 408 may contribute a nominal resistance of less than 1 ohm to a Rds_on measurement of one of the series and shunt branches. Advantageously, this nominal resistance can easily be accounted for when defining the pass/fail criteria.

In this example, the FET of the ESD protection circuit 408 comprises a biasing arrangement as illustrated in the Figure inset. The biasing arrangement may include a gate biasing resistor connected to the gate terminal of the FET 408 for biasing the received control signal. A body biasing resistor may be coupled to a body terminal of the FET 408 to provide a bulk bias to the FET 408. The FET of the ESD protection circuit 408 does not include any biasing resistor (or any other coupling) coupling the drain terminal to the source terminal of the FET 408. Such an arrangement would provide a permanent DC path in both the test mode and operational modes of the ESD protection circuit and is therefore not envisaged.

The control terminal of the ESD protection circuit 408 may receive the control signal to switch the ESD protection circuit 408 from the operational mode to the test mode. In this way, the ESD protection circuit 408 may operate in the operational mode as a default mode or in the absence of a control signal. Typically, DC testing will only be performed during manufacture of the IC, such as at a wafer testing stage. Therefore, the test mode may only be utilised at a beginning of life of the IC after which the ESD protection circuit 408 will operate in the operational mode.

The RFIC 412 may comprise a control circuit 428. The control circuit 428 may provide the functionality of the control circuit described above in relation to FIG. 3. In addition, the control circuit 428 may provide the control signal to the control terminal of the ESD protection circuit 408. The control circuit 428 may control the FET 408 by providing the control signal to increase or decrease a gate bias voltage of the gate terminal. The control circuit 428 may provide the control signal as a two-level bias signal with a first bias level corresponding to the operational mode and a second bias level corresponding to the test mode. In some examples, the FET 408 may be an NMOS transistor. The first bias level may correspond to a value less than or equal to zero volts or to a ground voltage and the second bias level may correspond to an asserted positive voltage. In this way, the NMOS transistor will remain switched off and in the operational mode while the control signal corresponds to zero volts or in the absence of a control signal.

The control circuit 428 may comprise one or more test pads. The test pads may be accessible by an automated test machine prior to packaging of the RFIC 412. For example, the test pads may be accessible during wafer testing. The control circuit 428 may provide the control signal to the control terminal of the ESD protection circuit 408 in response to receiving a test enable signal at a test pad. For example, the control circuit 428 may provide the control signal to switch the ESD protection circuit 408 into the test mode for DC testing.

The automated test machine may then probe the IO pin 402-2 and another terminal of the remaining circuitry, such as the antenna pin 404-1 or the reference terminal 426, to measure a test parameter of a signal path between two terminals. For example, the automated test machine may measure Rds_on of the second series branch 422 or the second shunt branch 424 by injecting a current through the branch and measuring a voltage drop between the receiver pin 404-2 and the antenna pin 404-1 or the reference terminal 426 respectively.

Although the switch module 412 of FIG. 4 is illustrated with only one DC blocking module coupled to the receiver pin 404-2, the switch module 412 may also comprise a DC blocking module coupled to the antenna pin 404-1 and/or the transmission pin 404-3. Such DC blocking modules would comprise a further capacitor in parallel with a further ESD protection circuit as described above. As the signal levels can be higher at the antenna pin 404-1 and the transmission pin 404-3, the corresponding further DC blocking capacitor at each pin may be larger than the capacitor 402 coupled to the receiver pin 404-2. This can ensure that the RF voltage swing across the corresponding further capacitor remains low and that any FETs in the further ESD protection circuits do not turn ON during normal operation.

In this example, the ESD protection circuit 408 comprises a single FET, MESD. In other examples, the ESD protection circuit 408 may comprise a plurality of FETs. The conduction channels of the FETS may be connected in series to form the conduction path of the ESD protection circuit 408. The gate terminals of the plurality of FETS may be connected together to form the control terminal of the ESD protection circuit 408. In this way, a plurality of FETs can be stacked together to allow a higher DC voltage to be blocked. An advantage of using the FETs in the ESD protection circuit 408 rather than the diodes of FIG. 1A is that a fewer number of FETs are required in a stack compared to the number of diodes required to block the same level of DC voltage. This is because the breakdown drain-source (BVDS) of the RF switch MOSFETs are generally 3 to 4 times larger than a diode ON voltage. As a result, the ESD protections circuit has a lower parasitic capacitance/loss and occupies a smaller silicon area compared to the diode approach. In yet further examples, the ESD protection circuit 408 may comprise a bipolar junction transistor or a plurality of bipolar junction transistors.

Although the example RFIC of FIG. 4 is a SPDT switch module 412 implemented on a SOI CMOS technology, the DC blocking module, comprising the DC blocking capacitor 402 with ESD protection circuit 408 in parallel, is neither application constrained, nor technology constrained. The DC blocking module can be coupled to an IO pin of any IC that requires a DC blocking capacitor and DC testing capability. For example, the DC blocking module may be incorporated on a high voltage (non-RF) IC. The DC blocking module can be used in technologies other than SOI with FET devices suitable for ESD events, though the performance benefit of having the DC-blocking capacitor on the switch die may be reduced.

Figure 5:
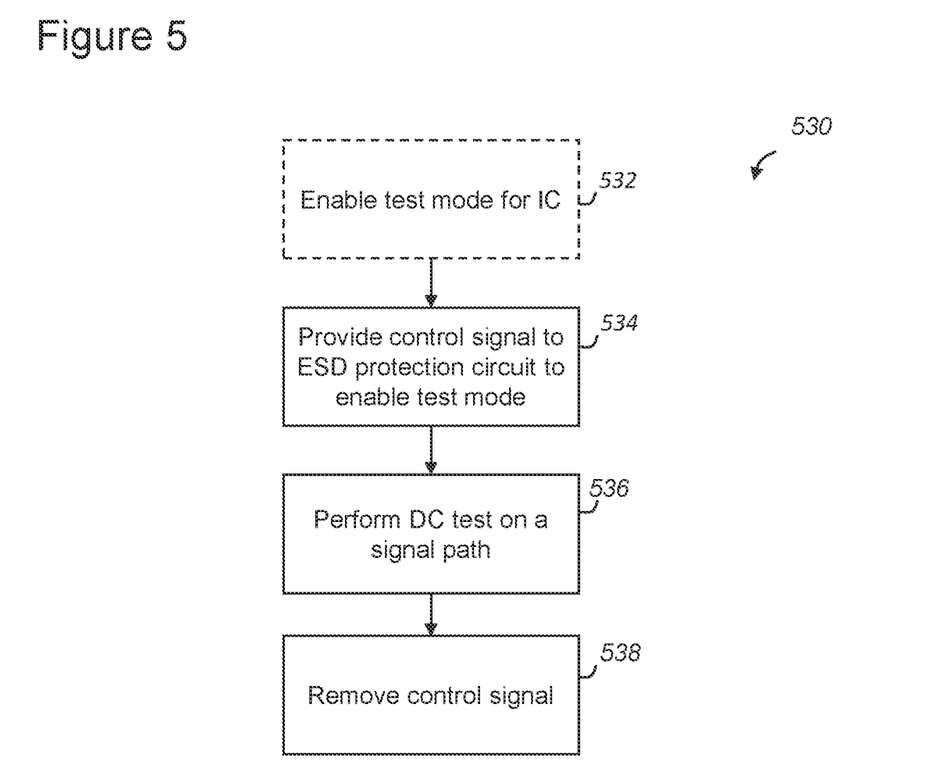
FIG. 5 illustrates a method of processing a semiconductor wafer according to an embodiment of the present disclosure.

FIG. 5 illustrates a method of processing a semiconductor wafer comprising a plurality of any of the ICs disclosed herein according to an embodiment of the present disclosure.

The process 530 is performed on an IC having one or more DC blocking modules connected to a respective IO pin and comprising a controllable ESD protection circuit as described above, for example the RFIC of FIG. 4.

The illustrated process 530 is performed for one or more DC blocking modules of each IC on the wafer. The process may be performed for a first DC blocking module of a first IC to perform a first DC test on circuitry of the first IC coupled to the first DC blocking module. The process may then be performed for a second DC blocking module of the first IC to perform a second DC test on circuitry of the first IC coupled to the second DC blocking module, and so on. Each DC test may then be performed on a second IC, and so on until each IC on the wafer has been fully tested. In some examples, the process 530 may be performed simultaneously for a plurality of DC modules and/or a plurality of ICs on the wafer using multi-site testing.

Firstly, considering the process 530 for a first DC blocking module of a first IC, a first optional step 532 comprises enabling a test mode for the IC. Enabling the test mode may be achieved in a number of ways such as applying a test enable signal to a test pad of the IC using an automated test machine. In other examples, enabling the test mode of the IC may be achieved by running a dedicated test interface or using test-features from a functional interface. A second step 534 of providing a control signal to the control terminal of the ESD protection circuit of the first DC blocking module to operate the ESD protection circuit in the test mode, may be performed in response to the first step 532.

In some examples, each DC blocking module will have a corresponding test pad and providing the test enable signal to the test pad will provide the control signal to the ESD protection device of the corresponding DC blocking module to enable the test mode. In other examples, the test pad may be connected to a control circuit of the IC. The control circuit can receive the test enable signal and process information in the test enable signal to determine one or more DC blocking modules to put into the test mode. The control circuit can then provide the control signal to the ESD protection device of the one or more DC blocking modules to enable the test mode.

A third step 536 comprises performing a DC test on a signal path between the IO terminal corresponding to the first DC blocking module and a further terminal of the remaining circuitry of the IC. In some examples, the further terminal may comprise a reference terminal such as ground or a voltage rail. In other examples, the further terminal may comprise a further IO pin with a further DC blocking module. In such examples, the process may further comprise providing a control signal to the control terminal of the ESD protection circuit of the further blocking module to operate the further blocking module in the test mode. In this way, the signal path under test will comprise a DC conduction path suitable for DC testing.

The DC test may comprise any suitable test such as an Rds_on measurement for a series or shunt branch in a SPDT switch module as described above in relation to FIGS. 3 and 4. If the first DC blocking module corresponds to the receiver pin or the transmission pin, the further terminal may comprise a reference terminal for DC testing a shunt branch or the further terminal may comprise the antenna IO pin for DC testing a series branch. The antenna IO pin may have a further DC blocking module and the process 530 may therefore comprise providing a control signal to enable the test mode of the further DC blocking module.

Performing the DC test may comprise the automated test machine probing the IO pin and the further terminal of the remaining circuitry, such as the antenna pin 404-1 or the reference terminal 426, to measure a test parameter of a signal path between two terminals. For example, the automated test machine may measure Rds_on of the second series branch or the second shunt branch by injecting a current through the branch and measuring a voltage drop between the receiver pin and the antenna pin or the reference terminal respectively.

A fourth step 538 may comprise removing the control signal from the control terminal of the ESD protection circuit of the first DC blocking module to operate the ESD protection circuit in an operational mode.

The process 530 may be repeated for one or more other DC blocking modules of the first IC to perform further DC tests on the first IC. The process may then be repeated for the same DC blocking modules of each IC on the wafer. In some examples, the process 530 may be performed simultaneously for a plurality of DC blocking modules of an IC and/or a plurality of ICs on a wafer.

The process may further comprise identifying compliant ICs that pass a test requirement of each DC test performed on the IC. The process may further comprise dicing the semiconductor wafer into individual ICs, packaging each compliant IC and discarding non-compliant ICs that failed one or more DC tests. Packaging the compliant ICs may include blocking access to the one or more test pads of the IC. For example, the test pads may not be wire bonded to any package pins. In this way, all ESD protection circuits of the IC will remain in the operational mode following packaging and provide ESD protection to their respective DC blocking capacitors.

The disclosed ICs include a ESD protection circuit, such as a MOSFET switch, placed in parallel to a DC blocking capacitor at an IO pin. The ESD protection circuit has a dual purpose: during normal operation and ESD testing, the MOSFET is off, and works as an ESD protection. During testing, the MOSFET is on, and provides a DC path via which DC tests can be carried out in an industrial environment.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An integrated circuit (IC) comprising one or more DC blocking modules connected to a respective input/output (IO) pin of the IC, each DC blocking module comprising:
   a capacitor having a first terminal connected to the respective IO pin and a second terminal connected to a node of circuitry of the IC; and
   an electrostatic discharge (ESD) protection circuit connected in parallel to the capacitor, the ESD protection circuit comprising:
      a conduction path connected between the first terminal of the capacitor and the second terminal of the capacitor; and
      a control terminal configured to receive a control signal to switch the ESD protection circuit between:
         an operational mode in which the conduction path is in a non-conducting state and provides ESD protection to the capacitor; and
         a test mode in which the conduction path is in a conducting state and short circuits the capacitor.

2. The IC of claim 1, wherein the ESD protection circuit of each DC blocking module comprises a transistor, wherein:
   a conduction channel of the transistor forms the conduction path of the ESD protection circuit; and a control terminal of the transistor forms the control terminal of the ESD protection circuit.

3. The IC of claim 2, wherein the transistor is a field effect transistor (FET).

4. The IC of claim 1, wherein the ESD protection circuit of one or more DC blocking modules comprises a plurality of transistors, wherein:
conduction channels of the transistors are connected in series to form the conduction path of the ESD protection circuit; and
control terminals of the transistors are connected together to form the control terminal of the ESD protection circuit.

5. The IC of claim 4, wherein the plurality of transistors comprises a plurality of FETs.

6. The IC of claim 1, wherein the control terminal of the ESD protection circuit of each DC blocking module is configured to receive the control signal to switch the ESD protection circuit from the operational mode to the test mode.

7. The IC of claim 1, wherein the ESD protection circuit of each DC blocking module is configured to operate in the operational mode in the absence of a control signal.

8. The IC of claim 1, wherein the IC is a radio frequency IC (RFIC).

9. The IC of claim 1, further comprising a control circuit, the control circuit configured to provide the control signal to the control terminal of the ESD protection circuit of each DC blocking module.

10. The IC of claim 9, wherein the control circuit comprises one or more test pads, wherein the one or more test pads are accessible to an automated test machine prior to packaging of the IC.

11. The IC of claim 10, wherein the control circuit is configured to provide the control signal to the control terminal of the ESD protection circuit of one or more DC blocking modules in response to receiving a test enable signal at one or more test pads.

12. An IC package comprising:
the IC of claim 10; and
a package housing the IC,
wherein the package prevents access to the one or more test pads.

13. A switch circuit for a radio frequency front end (RFFE) module, comprising the IC of claim 1.

14. A RFFE module comprising the IC of claim 1.

* * * * *